(12) United States Patent
Bonanni et al.

(10) Patent No.: US 6,879,157 B1
(45) Date of Patent: Apr. 12, 2005

(54) FERROMAGNETIC FRAME WITH LAMINATED CARBON STEEL

(75) Inventors: Luciano B. Bonanni, Dix Hills, NY (US); Anthony Tenore, Yonkers, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/925,402

(22) Filed: Aug. 25, 2004

Related U.S. Application Data

(62) Division of application No. 09/988,941, filed on Nov. 21, 2001, now Pat. No. 6,822,449.
(60) Provisional application No. 60/252,697, filed on Nov. 22, 2000.

(51) Int. Cl.⁷ ................................................ G01V 3/00
(52) U.S. Cl. ....................................... 324/309; 324/318
(58) Field of Search .................................. 324/318, 319, 324/309, 300, 322; 335/296; 29/609

(56) References Cited

U.S. PATENT DOCUMENTS

| | | |
|---|---|---|
| 4,407,292 A | 10/1983 | Edrich |
| 4,534,358 A | 8/1985 | Young |
| 4,608,991 A | 9/1986 | Rollwitz |
| 4,613,820 A | 9/1986 | Edelstein et al. |
| 4,629,989 A | 12/1986 | Riehl et al. |
| 4,641,119 A | 2/1987 | Moore |
| 4,668,915 A | 5/1987 | Daubin et al. |
| 4,672,346 A | 6/1987 | Miyamoto et al. |
| 4,675,609 A | 6/1987 | Danby et al. |
| 4,679,022 A | 7/1987 | Miyamoto et al. |
| 4,707,663 A | 11/1987 | Minkoff et al. |
| 4,766,378 A | 8/1988 | Danby et al. |
| 4,770,182 A | 9/1988 | Damadian et al. |
| 4,777,464 A | 10/1988 | Takabatashi et al. |
| 4,829,252 A | 5/1989 | Kaufman |
| 4,920,318 A | 4/1990 | Misic et al. |
| 4,924,198 A | 5/1990 | Laskaris |
| 4,943,774 A | 7/1990 | Breneman et al. |
| 4,968,937 A | 11/1990 | Akgun |

(Continued)

FOREIGN PATENT DOCUMENTS

| | | |
|---|---|---|
| DE | 3 140 225 A1 | 4/1983 |
| JP | 4-332531 | 11/1992 |
| JP | 62-26052 | 8/1994 |

OTHER PUBLICATIONS

Copy of Damadian 3.0–067 CIP DIV V Application Office Action dated Jan. 15, 2003.
Copy of Damadian e.0–067 CIP DIV V Application Office Action dated Jul. 25, 2003.
Copy of Specification in Damadian 3.0–067 CIP DIV V Application.

*Primary Examiner*—Brij B. Shrivastav
(74) *Attorney, Agent, or Firm*—Lerner, David, Littenberg, Krumholz & Mentlik, LLP

(57) ABSTRACT

A ferromagnetic frame for supporting a magnet in a magnetic resonance device used for magnetic resonance studies and a method for making the ferromagnetic frame are disclosed. The ferromagnetic frame includes at least one structural element formed of laminated steel layers. The steel layers are relatively lightweight and easily maneuverable compared to solid steel. The method includes laminating the steel layers together to form each of the components of the ferromagnetic frame and then assembling the frame. The ferromagnetic frame of the invention may be incorporated into a full-room magnetic resonance device, in which case the upper support is the ceiling of the room, the lower support is the floor, and the flux return members are the walls. The invention may be incorporated into pre-existing buildings dues to the maneuverability of the layers.

16 Claims, 10 Drawing Sheets

U.S. PATENT DOCUMENTS

| | | |
|---|---|---|
| D313,073 S | 12/1990 | Kaufman et al. |
| 4,985,678 A | 1/1991 | Gangarosa et al. |
| 5,050,605 A | 9/1991 | Eydelman et al. |
| 5,065,701 A | 11/1991 | Punt |
| 5,124,651 A | 6/1992 | Danby et al. |
| 5,134,374 A | 7/1992 | Breneman et al. |
| 5,153,546 A | 10/1992 | Laskaris |
| 5,194,810 A | 3/1993 | Breneman et al. |
| 5,197,474 A | 3/1993 | Englund et al. |
| 5,207,224 A | 5/1993 | Dickinson et al. |
| 5,211,165 A | 5/1993 | Dumoulin et al. |
| 5,229,723 A | 7/1993 | Sakurai et al. |
| 5,250,901 A | 10/1993 | Kaufman et al. |
| 5,304,932 A | 4/1994 | Carlson |
| 5,305,749 A | 4/1994 | Li et al. |
| 5,315,244 A | 5/1994 | Griebeler |
| 5,315,276 A | 5/1994 | Huson et al. |
| 5,317,298 A | 5/1994 | Dorri et al. |
| 5,382,904 A | 1/1995 | Pissanetzky |
| 5,382,905 A | 1/1995 | Miyata et al. |
| 5,412,363 A | 5/1995 | Breneman et al. |
| 5,436,607 A | 7/1995 | Chari et al. |
| 5,490,513 A | 2/1996 | Damadian et al. |
| 5,519,372 A | 5/1996 | Palkovich et al. |
| 5,654,603 A | 8/1997 | Sung et al. |
| 5,671,526 A | 9/1997 | Merlano et al. |
| 5,754,085 A | 5/1998 | Danby et al. |
| 5,862,579 A | 1/1999 | Blumberg |
| 6,014,070 A | 1/2000 | Danby et al. |
| 6,023,165 A | 2/2000 | Damadian et al. |
| 6,150,819 A | 11/2000 | Laskaris et al. |
| 6,201,394 B1 | 3/2001 | Danby et al. |
| 6,208,144 B1 | 3/2001 | McGinley et al. |
| 6,226,856 B1 | 5/2001 | Kazama et al. |
| 6,259,252 B1 | 7/2001 | Laskaris et al. |
| 6,677,753 B1 * | 1/2004 | Danby et al. ............ 324/318 |
| 6,822,449 B1 * | 11/2004 | Bonanni et al. ......... 324/318 |
| 6,828,792 B1 * | 12/2004 | Danby et al. ............ 324/318 |

* cited by examiner

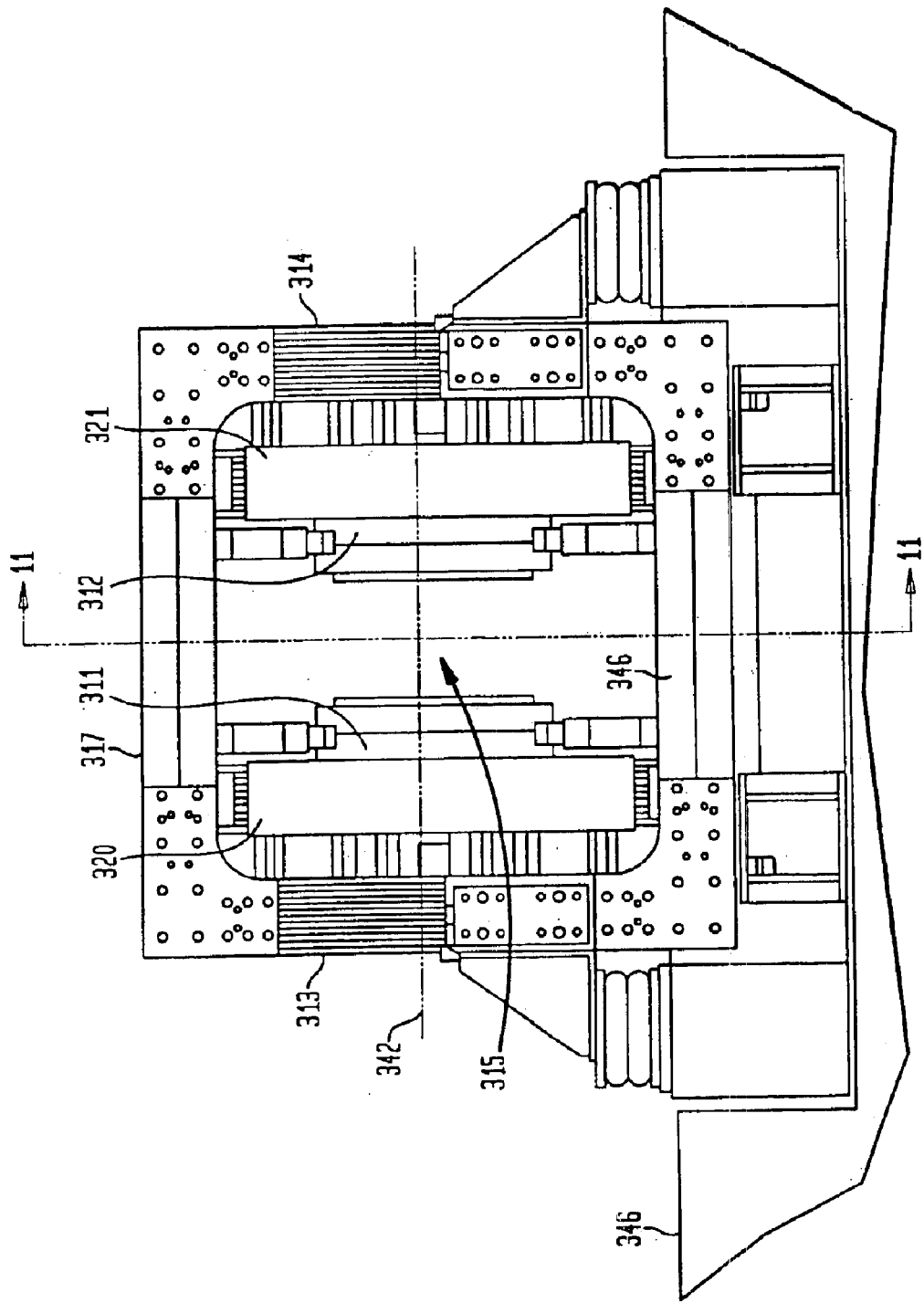

FERROMAGNETIC FRAME WITH LAMINATED CARBON STEEL

CROSS-REFERENCE TO RELATED APPLICATIONS

The present application is a divisional of U.S. application Ser. No. 09/988,941 filed Nov. 21, 2001, now U.S. Pat. No. 6,822,449 and claims benefit of U.S. application Ser. No. 60/252,697, filed Nov. 22, 2000, the disclosure of which is hereby incorporated by reference herein in its entirety.

BACKGROUND OF THE INVENTION

The present invention relates to magnetic resonance devices and more particularly to magnetic resonance device frames comprising laminated steel layers.

Magnetic resonance studies are typically carried out in strong magnetic fields greater than one kilogauss and require a magnetic field homogeneity of the order of a few parts per million. Magnetic resonance devices comprise a magnet capable of achieving the required field strength while attaining the necessary field homogeneity over the large volume. The magnetic resonance apparatus usually includes a support structure or frame for the magnet, which is typically comprised of solid steel. The ferromagnetic frame defines a magnetic flux return path for eliminating strong leakage magnetic fields.

Typically, the flux return path includes flux return members, supports for the poles and pole stems remote from the magnet poles. Since the ferromagnetic frame is constructed of solid steel, the ferromagnetic frames currently in use are bulky and difficult to fabricate, transport and assemble. Additionally, the bulk of the current solid steel frames contribute to the costliness in manufacturing the frames.

It is further desirable for the support structure or ferromagnetic frame of a magnetic resonance device to comprise ferromagnetic material. The dimensions of the yoke cross sections along the flux return paths become substantial to avoid magnetic saturation of the ferromagnetic yokes at high field strengths. Greater yoke cross-sectional area results, of course, in an increase in magnet weight. The substantial cross-section and weight of these magnets including the ferromagnetic frame limits the maneuverability of the magnet. It is therefore advantageous to have an alternate method of assembling the ferromagnetic frames for certain applications.

Thus, it is desirable to have an apparatus and methods which would permit easy fabrication, transport and assembly of a ferromagnetic frame of a magnetic resonance apparatus.

Accordingly, it is an object of the invention to provide a magnetic resonance device that is easily maneuverable and can easily be transported and assembled in pre-existing buildings.

It is another object of the invention to provide a magnetic resonance device having a frame comprising laminated steel layers.

It is another object of the invention to provide a magnetic resonance device having a ferromagnetic frame elements comprised of layers wherein the weight of the individual layer is substantially less than the weight of existing components.

SUMMARY OF THE INVENTION

According to the invention a magnetic resonance device includes a magnet defining a ferromagnetic structure formed of laminated steel layers. The ferromagnetic structure or frame supports a magnet for use in magnetic resonance studies. A pair of opposed ferromagnetic pole pieces are disposed facing each other and defining a patient-receiving gap therebetween for receiving a patient. The ferromagnetic structure includes at least one structural element and defines a flux return path. The structural elements are preferably formed of laminated steel layers.

In a preferred embodiment of the invention, flux return path extends through at least one of the structural elements of the frame formed from laminated steel layers. The ferromagnetic structure may further include a pair of opposed pole supports for supporting the pole pieces. The flux return members may extend between the pole supports. In addition, a pole stem may extend from the each of the supports. The pole stems may be formed of laminated steel layers transverse to the pole axis extending between the pole pieces. The pole axis may be horizontally or vertically oriented.

The magnetic resonance imaging device further includes a magnetic flux source. Preferably, the laminated steel layers are low carbon sheets laminated together using a fastening method such as bolts or epoxy. The sheets preferably have a thickness in the range of about 0.014 inch to about 0.500 inch.

In accordance with another aspect of the invention, the ferromagnetic structure comprises a room wherein the structural elements of the support structure comprise the ceiling, floor, and walls. One or more of the structural elements of room may be formed of laminated steel layers.

In accordance with another aspect of the invention, a method of constructing a ferromagnetic structure for a magnetic resonance imaging device at a site where the device will be used is provided. The method includes forming the ferromagnetic frame at the site by laminating steel layers together to form one of the structural elements of the frame. Other elements of the frame are then constructed by building upon the completed structural element, layer by layer. The completed ferromagnetic frame is then provided with a pair of pole pieces in an opposed relationship defining a patient-receiving gap.

In one embodiment of the invention, the method may be implemented to construct the magnetic resonance imaging device in a room of a pre-existing building.

In another embodiment of the invention, each of the structural elements may be formed individually and then the ferromagnetic structure may be constructed by bolting each of the elements together.

BRIEF DESCRIPTION OF THE DRAWINGS

Additional objects and features of the invention will appear from the following description of the preferred embodiments of the invention in conjunction with the accompanying drawings.

FIG. 12 is a front elevation view of the magnetic resonance device of FIG. 10.

DETAILED DESCRIPTION

Figure 1:
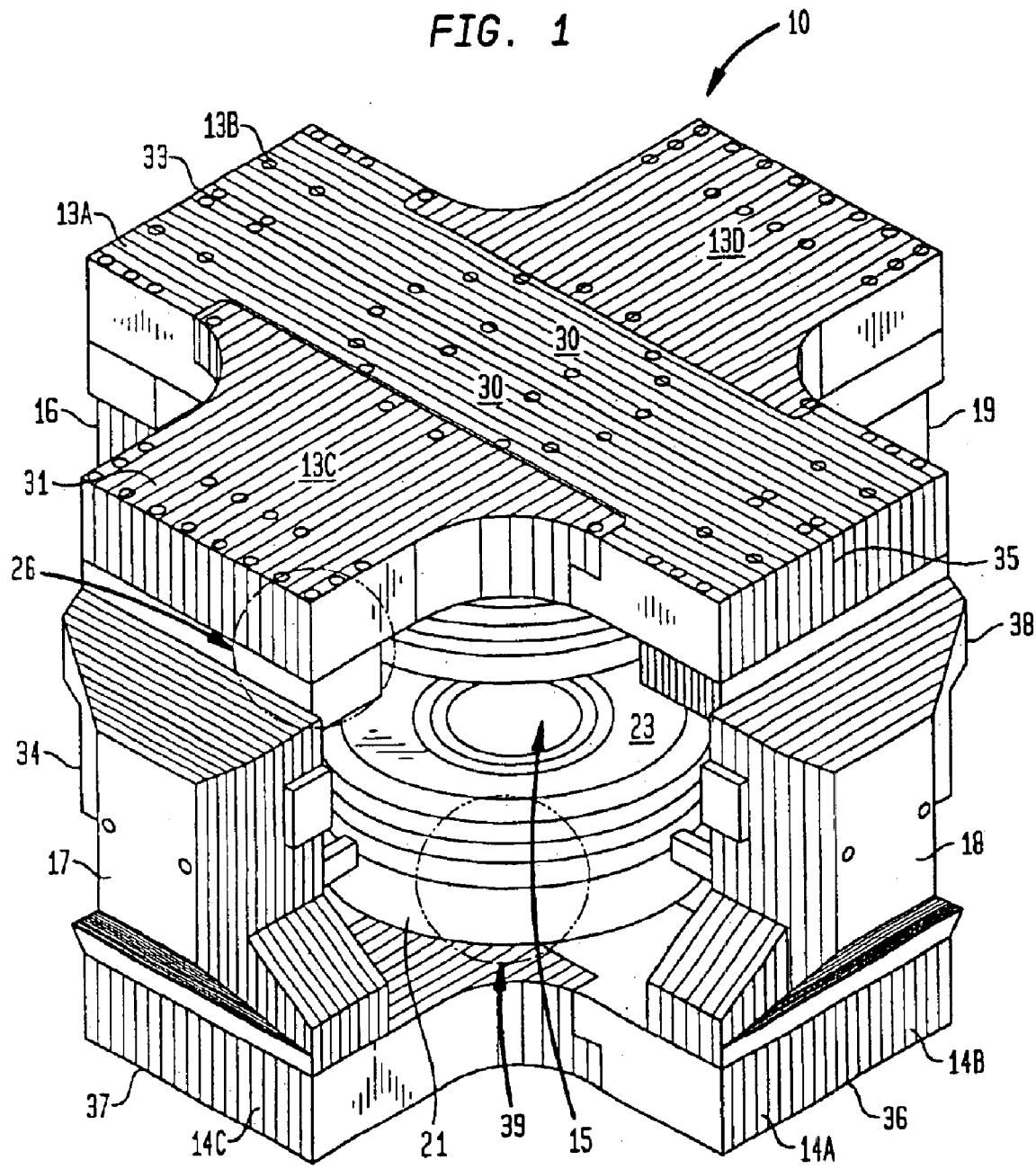
FIG. 1 is a perspective view of a magnetic resonance imaging device in accordance with one embodiment of the invention.
Figure 2A:
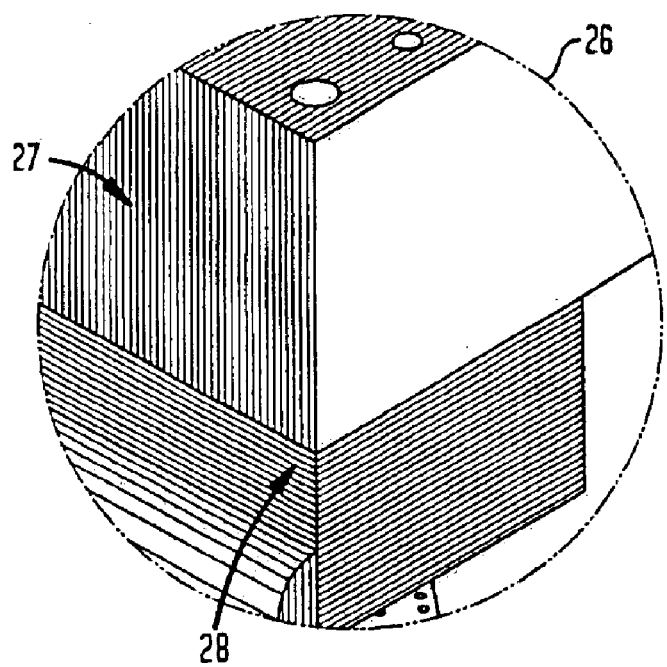
FIG. 2A is a blown-up perspective view of the detail of section 26 in FIG. 1.
Figure 2B:
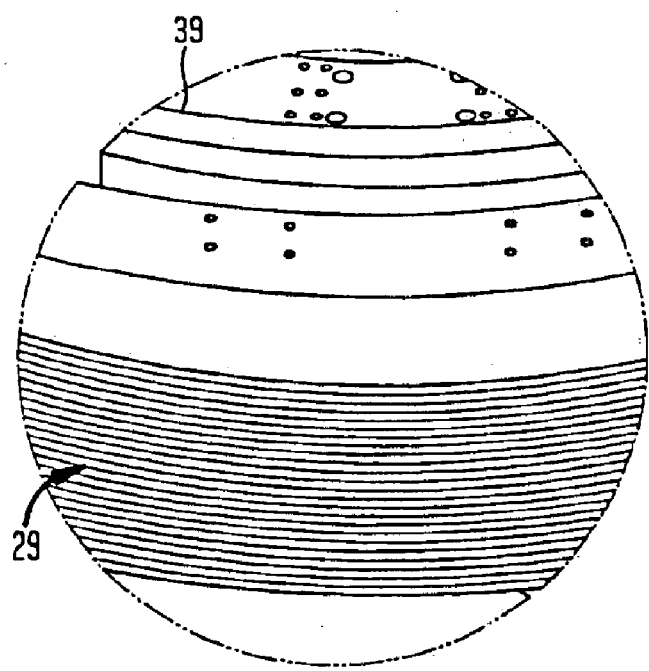
FIG. 2B is a blown-up perspective view of the detail of section 39 in FIG. 1.

A magnetic resonance device 10 used in magnetic resonance studies as shown in FIGS. 1, 3, 4 and 5 is generally comprised of a magnet including a ferromagnetic support structure or ferromagnetic frame. A pair of ferromagnetic poles pieces 11 and 12 are disposed in an opposed relationship so that the pole pieces define a patient-receiving gap 15. The ferromagnetic frame includes at least one structural element, and preferably a plurality of parts. The upper ferromagnetic pole piece 11 and the lower ferromagnetic pole piece 12 are mounted to the frame at an upper pole piece support 13 and a lower pole piece support 14, respectively, which constitute a structural element of the frame.

Figure 4:
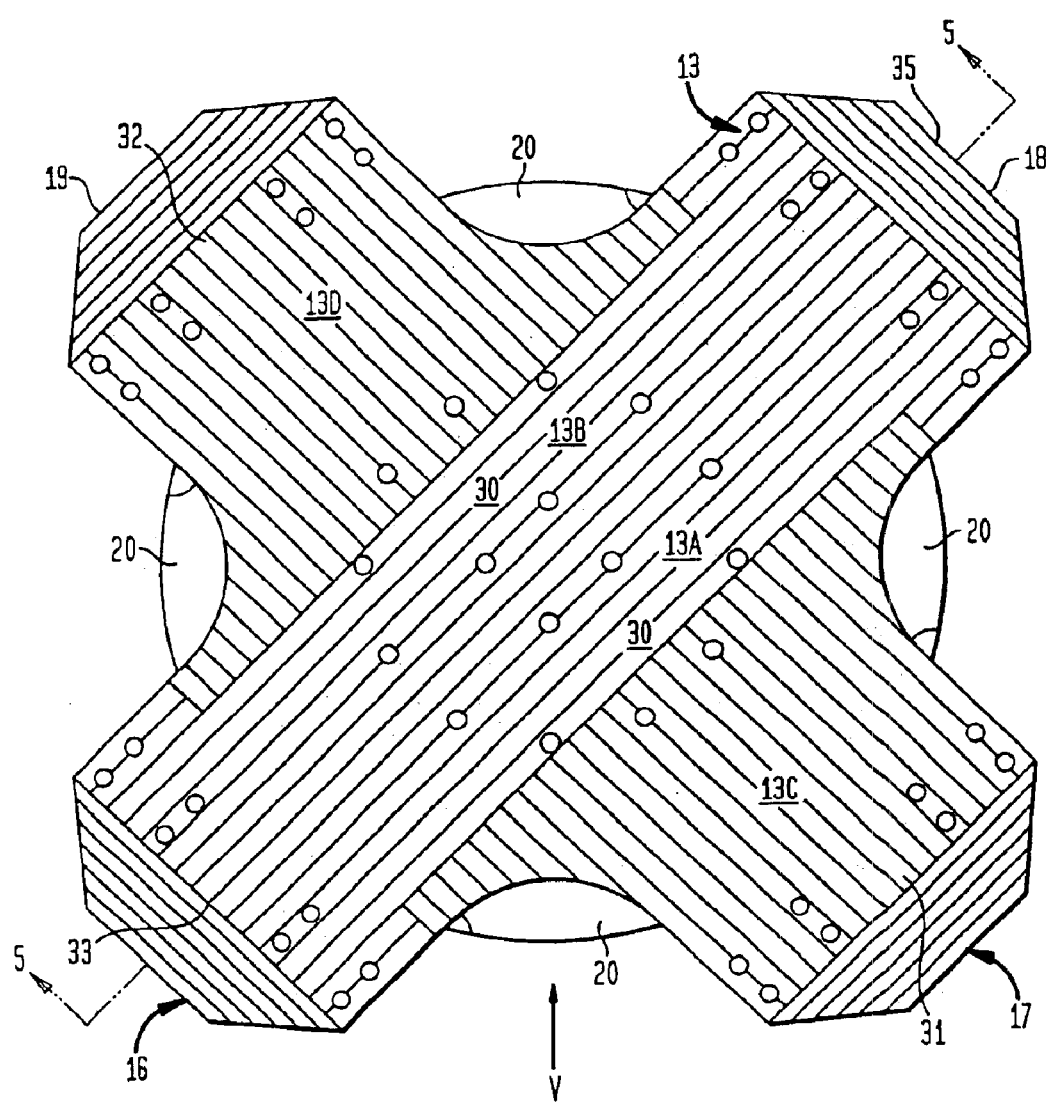
FIG. 4 is a top plan view of the magnetic resonance device of FIG. 1.

In a preferred embodiment, the upper pole piece support 13 comprises a pair of longitudinal members 13A and 13B and a pair of opposing perpendicular members 13C and 13D. The lower pole piece support 14 comprises a pair of longitudinal members 14A and 14B and a pair of opposing perpendicular members 14C and 14D. As shown in FIGS. 1 and 4, the longitudinal members extend substantially horizontally parallel to each other and the opposing perpendicular members extend substantially perpendicularly from a center area 30 of the longitudinal members. The opposing perpendicular members each define distal ends 31, 32, 37, 38 remote from the center area 30.

The ferromagnetic frame further comprises a plurality flux return members 16–19, which support the upper and lower pole piece supports 13, 14 and constitute another structural element of the frame. Flux return member 16 extends substantially vertically between a first end 33 of the upper longitudinal members 13A, 13B and a first end 34 of the lower longitudinal members 14A, 14B. Flux return member 18 extends substantially vertically between a second end 35 of upper longitudinal members 13A, 13B and a second end 36 of the lower longitudinal members 14A, 14B. Flux return member 17 extends substantially vertically between the distal end 31 of upper perpendicular member 13C and the distal end 37 of lower perpendicular member 14C. Similarly, flux return member 19 extends substantially vertically between the distal end 32 of upper perpendicular member 14D and the distal end 38 of lower perpendicular member 14D.

Figure 3:
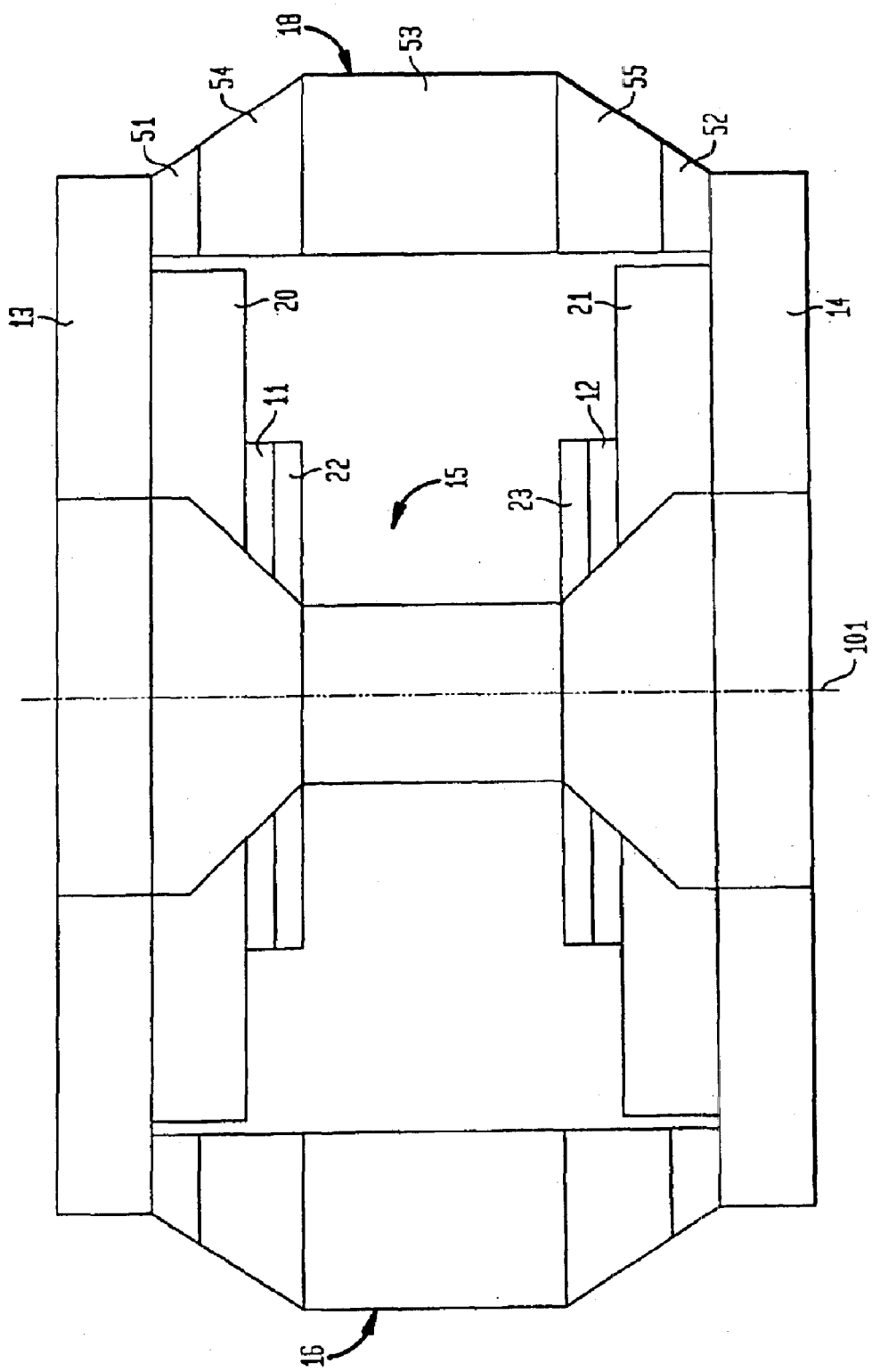
FIG. 3 is a side elevation view of the magnetic resonance device of FIG. 1.

Referring to FIG. 3, each of the flux return members has an upper base portion 51 and a lower base portion 52 which are the widest parts of the respective flux return member. The flux return member further comprise a middle portion 53 which is the narrowest part of the member having the greatest dimension in the radial direction relative to the pole pieces. The flux return member further comprises an upper transition portion 54 and a lower transition portion 55. The radial dimension of the upper transition portion progressively increases the further the distance from the base portion 51 and toward the middle portion 53. The width of the transition portion similarly decreases from the maximum column width at the base portion 51 to the minimum column width of the middle portion 53 the further the distance from the base portion 51 toward the middle portion 53. The lower transition portion 55 similarly spans between the base portion 52 and the middle portion 53.

The patient-receiving gap 15 between the poles 11 and 12 is sufficiently large to receive the body of a patient who is to undergo study by magnetic resonance. Conductive coils or windings 20 and 21 are energizable for developing a magnetic field which passes through the gap 15 between pole pieces 11 and 12.

A pair of annular ferromagnetic structures 22, 23 referred to as shim bars are disposed on the pole faces of the pole pieces 11, 12 respectively. The shim bars 22, 23 reduce fringing of the magnetic field around the periphery of the pole pieces 11, 12, thereby increasing the volume of uniform magnetic field.

Figure 5:
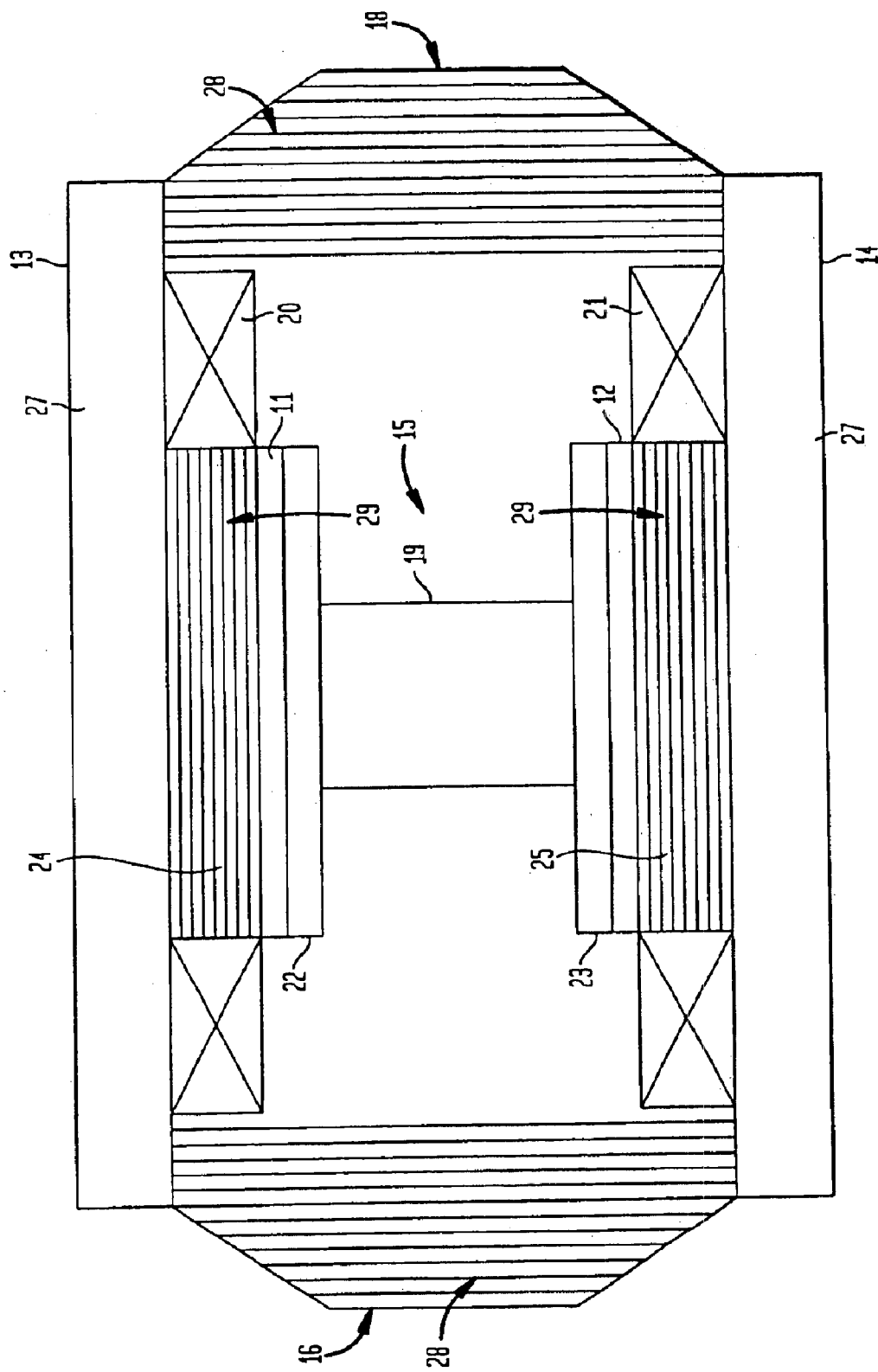
FIG. 5 is a sectional view taken along line 5—5 in FIG. 4.

FIG. 5 is a vertical section taken along line 5—5 in FIG. 4. The upper and lower supports 13, 14 are secured to the columns, for example, by threaded shafts. The upper pole piece 11 is secured to the upper pole piece support 13 through intermediary pole stem 24 and the lower pole piece 12 is secured to the lower pole piece support 14 through intermediary pole stem 25. The pole stems 24, 25 are another structural element of the frame.

Magnetic flux developed by the coil 20 flows through the pole stem 24 and into the pole piece 11. The magnetic flux leaves the pole piece 11 and crosses the gap 15 to enter the pole piece 12. The flux then travels through the poles stem 25 into the pole piece support 14 and returns through the flux return members 16–19 and pole piece support 13. The magnetic flux developed by the coil 21 follows the same path as the flux developed by coil 20.

Referring now to FIGS. 1–5, the ferromagnetic frame according to the present invention comprises the upper and lower pole piece supports 13, 14, the flux return members 16–19 and the pole stems 24, 25. Each of these elements of the ferromagnetic frame, as illustrated, is formed of laminated steel layers laminated together to form a single monolithic plate or layer for each element of the frame. The layers as illustrated in the figures are not drawn to scale, but are included for clarity of description. The upper and lower supports 13,14, including the perpendicular members and the longitudinal members, are formed of a plurality of laminated steel layers 27 laminated together to form each of the single monolithic elements. Similarly, each of the flux return members 16–19, including the upper base portion 51 is formed of laminated steel layers 28 laminated together to form a single monolithic element of the flux return member. The upper and lower pole stems 22,24 are formed of laminated steel layers 29 laminated together to form the single monolithic elements.

In a preferred embodiment, any one or more of the structural elements comprising the ferromagnetic frame is formed of laminated steel layers of the appropriate shape laminated together to form a single monolithic element. Therefore, each of the upper and lower longitudinal members 13A, 13B, 14A, 14C and the upper and lower opposing perpendicular members 13C, 13D, 14C and 14D are formed of a plurality of appropriately shaped laminated steel layers 27, the flux return members 16–19 are formed of a plurality of appropriately shaper laminated steel layers 28 and the upper and lower pole stems are formed of a plurality of appropriately shaped laminated steel layers 29. Although the figures show each of the structural components of the ferromagnetic frame formed of laminated steel layers, the present invention also contemplates a ferromagnetic frame in which only one or some of its structural components are formed of laminated steel layers with the other components being sold steel pieces.

The present invention also contemplates the orientation of the laminated steel layers in any direction, although the preferred orientation of the steel layers is illustrated in the figures. For example, FIG. 5 shows the laminated layers 27 of the upper and lower longitudinal members oriented with the length of the layer extending horizontally, the width of the layer extending vertically and the depth or thickness of the layer extending laterally. The layers, however, may be oriented with the length extending laterally and the thickness extending horizontally, in which case the length of the layers would be substantially less. Moreover, the laminated layers 28 of the flux return members 16–18 may be oriented with the thickness extending laterally, rather than horizontally as shown. Likewise, the laminated layers 29 of the pole stems 24,25 may be oriented vertically, rather than horizontally. Thus, steel layers of the appropriate shape may be oriented in any direction necessary to achieve the desired shape of the particular structural component of the ferromagnetic structure.

It is preferable that the laminated steel layers utilized in the ferromagnetic frame are made of ferromagnetic material such as low carbon sheets, although other ferromagnetic material may be utilized. The preferred content of the low carbon sheets is 0.01% carbon known as 1001 steel, although steel with a higher carbon content, such as 1006 or 1008 steel, can be utilized. Preferably, the thickness of each laminated steel sheet is in the range of about 0.014 inch to about 0.500 inch. Moreover, the thickness of each laminated steel sheet forming a single element does not have to be uniform. Therefore, a single structural element of the ferromagnetic frame may be formed of laminated steel layers having various thicknesses.

The layers may be fastened or laminated together using bolts, epoxy or any other fastening method.

Figure 6:
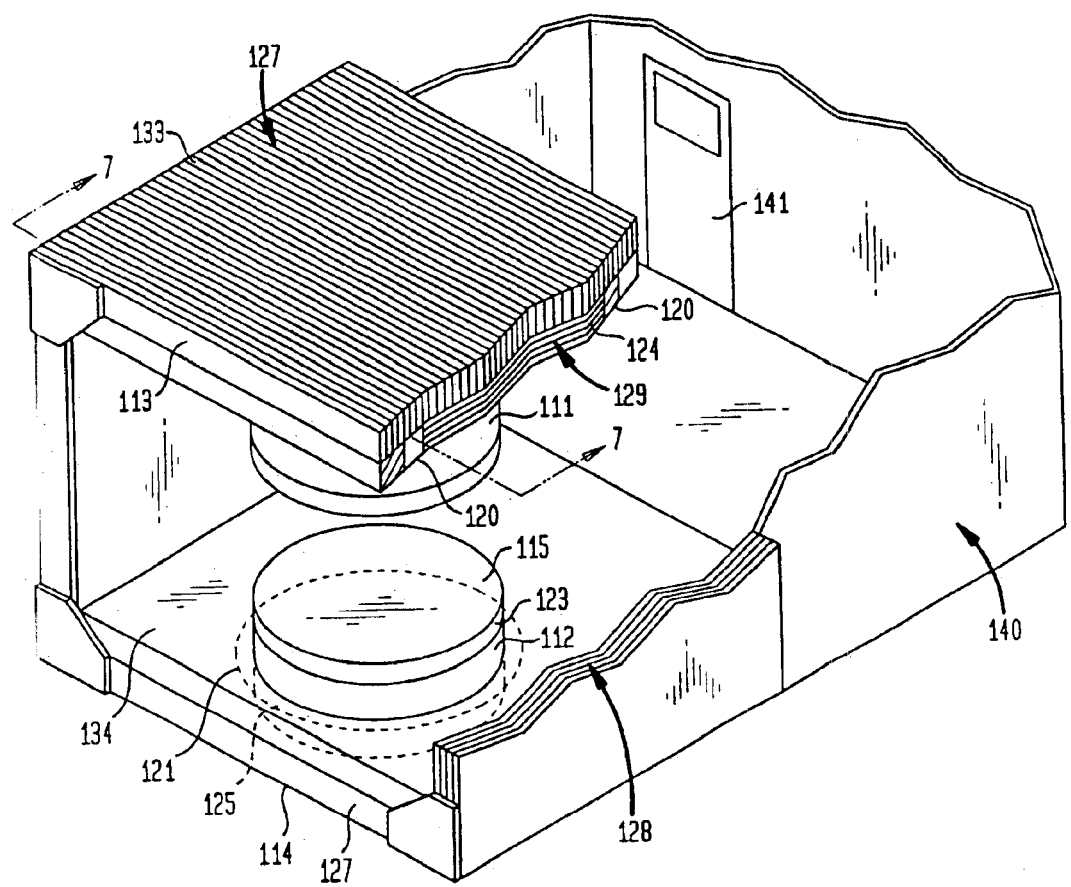
FIG. 6 is a perspective view depicting elements of the invention in accordance with one embodiment of the invention.
Figure 7:
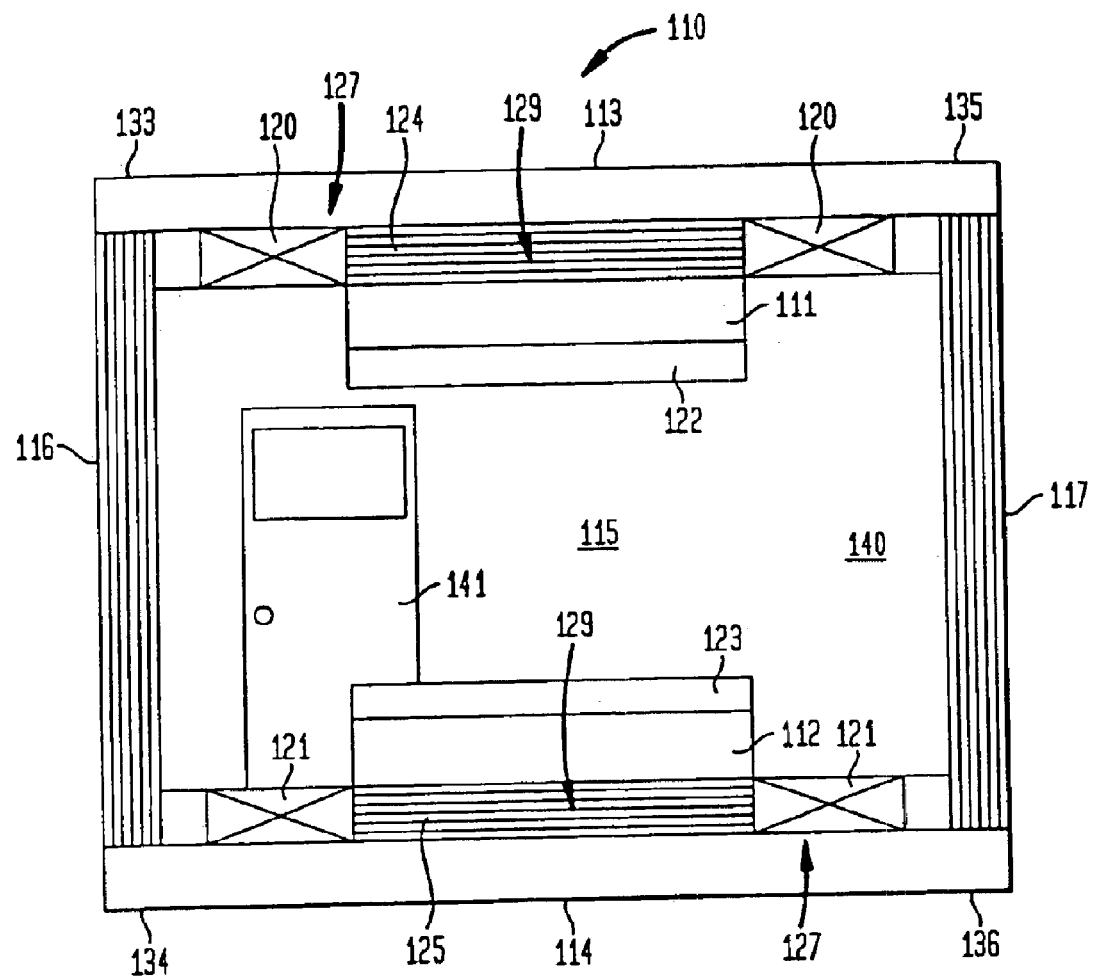
FIG. 7 is a sectional view taken along line 7—7 in FIG. 6.

The present invention may be incorporated into a full-room size magnetic resonance device, such as that disclosed in commonly assigned U.S. Pat. No. 6,201,394 issued Mar. 13, 2001, the disclosure of which is hereby incorporated by reference herein. FIGS. 6 and 7 show another embodiment of the invention where the magnetic resonance device is a full-room size. The ferromagnetic frame comprises the walls, ceilings and floor of the room. Thus, any one or more of the walls, ceiling and floor themselves are formed of laminated steel layers, as discussed below.

A magnetic resonance imaging device 110 is generally comprised of a magnet including a ferromagnetic support structure or ferromagnetic frame which is incorporated into the walls, ceiling and floor of a 140 room in which the magnetic resonance imaging device 110 is installed. The magnet includes a pair of ferromagnetic poles pieces 111 and 112. The upper ferromagnetic pole piece 111 is mounted to the ferromagnetic frame at an upper pole piece support 113, which also is the ceiling of the room 140. The lower ferromagnetic pole piece 112 is mounted to the ferromagnetic frame at a lower pole piece support 114, which is also the floor of the room 140.

The ferromagnetic frame further comprises a plurality flux return members 116,117, which support the upper and lower pole piece supports 113,114 and also act as walls of the room 140. Wall 116 extends substantially vertically between a first end 133 of the ceiling 113 and a first end 134 of the floor 114. Wall 18 extends substantially vertically between a second end 135 of the ceiling 113 and a second end 136 of the floor 14.

A patient-receiving gap 115 between the poles 111 and 112 is sufficiently large to receive the body of a patient who is to undergo study by magnetic resonance. Moreover, the room 140 is sufficiently large enough to accommodate medical personnel to perform any necessary procedures on the patient. For example, the room is such that medical personnel may stand within the room and perform procedures on the patient. Medical personnel are afforded access to the room 140 through door 141.

Conductive coils or windings 120 and 121 are energizable for developing a magnetic field which passes through the gap 115 between pole pieces 111 and 112.

A pair of annular ferromagnetic structures 122, 123 referred to as shim bars are disposed on the pole faces of the pole pieces 111, 112 respectively. The shim bars 122, 123 reduce fringing of the magnetic field around the periphery of the pole pieces 111, 112, thereby increasing the volume of uniform magnetic field.

The upper pole piece 111 is secured to the ceiling 113 through intermediary pole stem 124 and the lower pole piece 112 is secured to the floor 114 through intermediary pole stem 125.

Magnetic flux developed by the coil 120 flows through the pole stem 124 and into the pole piece 111. The magnetic flux leaves the pole piece 111 and crosses the gap 115 to enter the pole piece 12. The flux then travels through the poles stem 125 into the floor 114 and returns through the walls 116, 117 and ceiling 113. The magnetic flux developed by the coil 121 follows the same path as the flux developed by coil 120.

The ferromagnetic frame according to the present invention comprises the ceiling and floor 113,114, the walls 116,117 and the pole stems 124,125. Each of these elements of the ferromagnetic frame is formed of laminated steel layers laminated together to form a single monolithic plate or layer for each element of the frame. The ceiling 113 and floor 114 each comprise a plurality of laminated steel layers 127 laminated together to form the single monolithic element of the ceiling 113. Similarly, the walls 116, 117, are formed of laminated steel layers 128 laminated together to form a single monolithic element. The pole stems 124, 125 are each formed of laminated steel layers 129 laminated together to form a single monolithic element.

One or more the structural elements comprising the ferromagnetic frame is formed of laminated steel layers of the appropriate shape laminated together to form the single monolithic element. Therefore, the ceiling 113 and floor 114 are formed of a plurality of appropriately shaped laminated steel layers 127, the walls 116,117 are formed of a plurality of appropriately shaped laminated steel layers 128 and the upper and lower pole stems 124,125 are formed of a plurality of appropriately shaped laminated steel layers 129.

It is preferable that the laminated steel layers utilized in the ferromagnetic frame are made of ferromagnetic material such as low carbon sheets, although other ferromagnetic material may be utilized. The preferred content of the low carbon sheets is 0.01% carbon known as 1001 steel, although steel with a higher carbon content, such as 1006 or 1008 steel may be utilized. Preferably, the thickness of each steel laminated sheet is in the range of about 0.014 inch to about 0.500 inch.

The layers may be fastened or laminated together using bolts, epoxy or any other fastening method.

Figure 8:
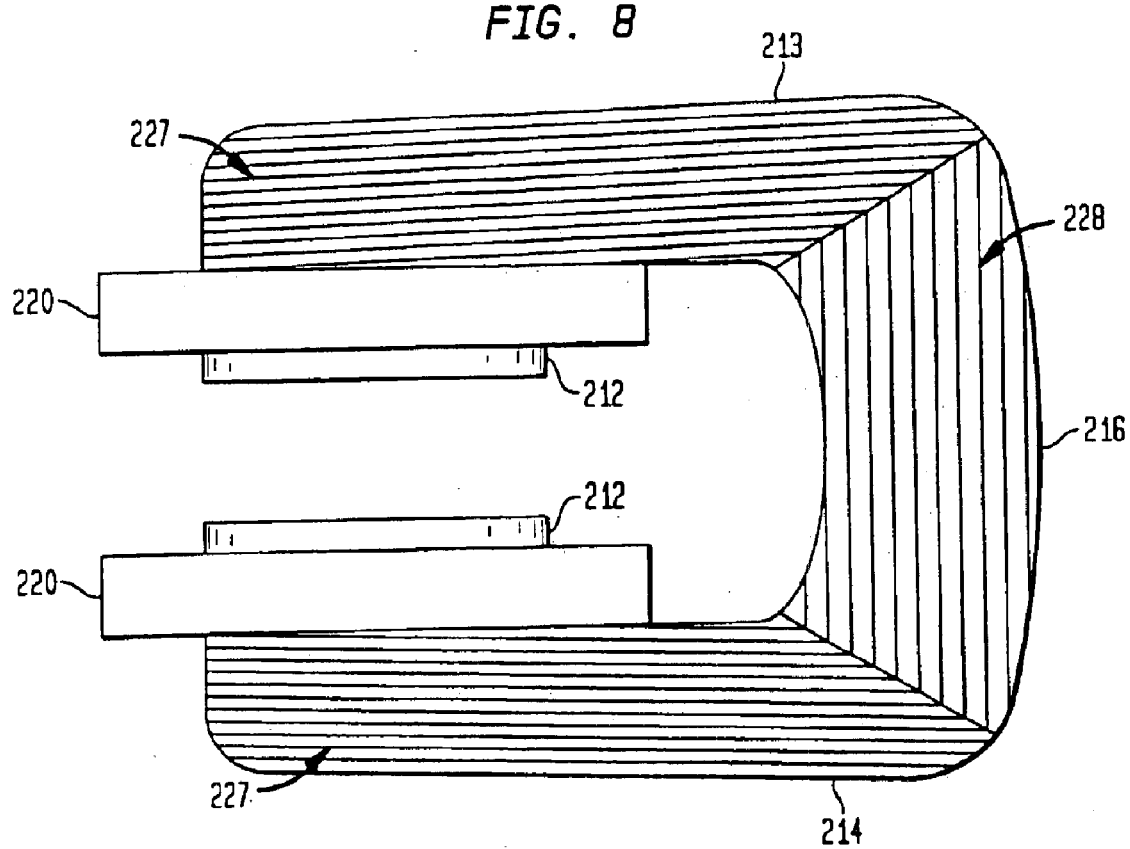
FIG. 8 is a top plan view of a magnetic resonance imaging device in accordance with one embodiment of the invention.
Figure 9:
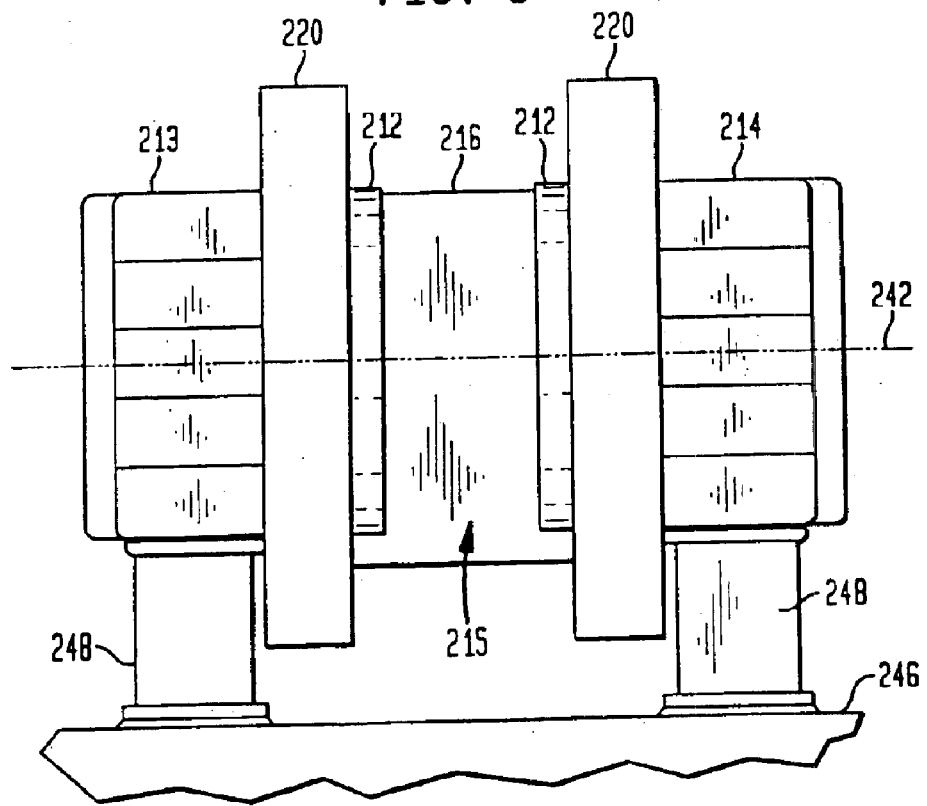
FIG. 9 is a side elevation view of the magnetic resonance imaging device of FIG. 8.

The ferromagnetic frame may also be incorporated into a magnetic resonance imaging device having a horizontal pole axis, such as the devices disclosed in commonly assigned U.S. patent application Ser. No. 09/789,460 filed Feb. 21, 2001 and Ser. No. 09/718,946 filed Nov. 22, 2000, the disclosures of which are hereby incorporated by reference herein. Referring now to FIGS. 8 and 9, another embodiment of the invention is shown. A magnetic resonance imaging device 210 includes a magnet having ferromagnetic frame and pole pieces 212 defining an opposing relationship along a horizontally oriented pole axis 242. The pole pieces define a patient-receiving gap 215. The frame includes a first support 213 and a second support 214. Flux return path 216 connects the first support 213 to the second support 214. Flux generating means such as permanent magnets, superconducting coils, or resistive electrical coils 220 are provided. The ferromagnetic frame is supported above a floor 246 by columns 248.

The structural elements of the frame are formed of a plurality of laminated steel layers. Therefore, the first and second supports 213, 214 comprise a plurality of steel layers 227 laminated together via bolts, epoxy or other fastening means. The flux return path 216 is also formed of a plurality of laminated steel layers 228. Thus, in this embodiment of the invention, the pole axis is horizontally oriented.

Figure 10:
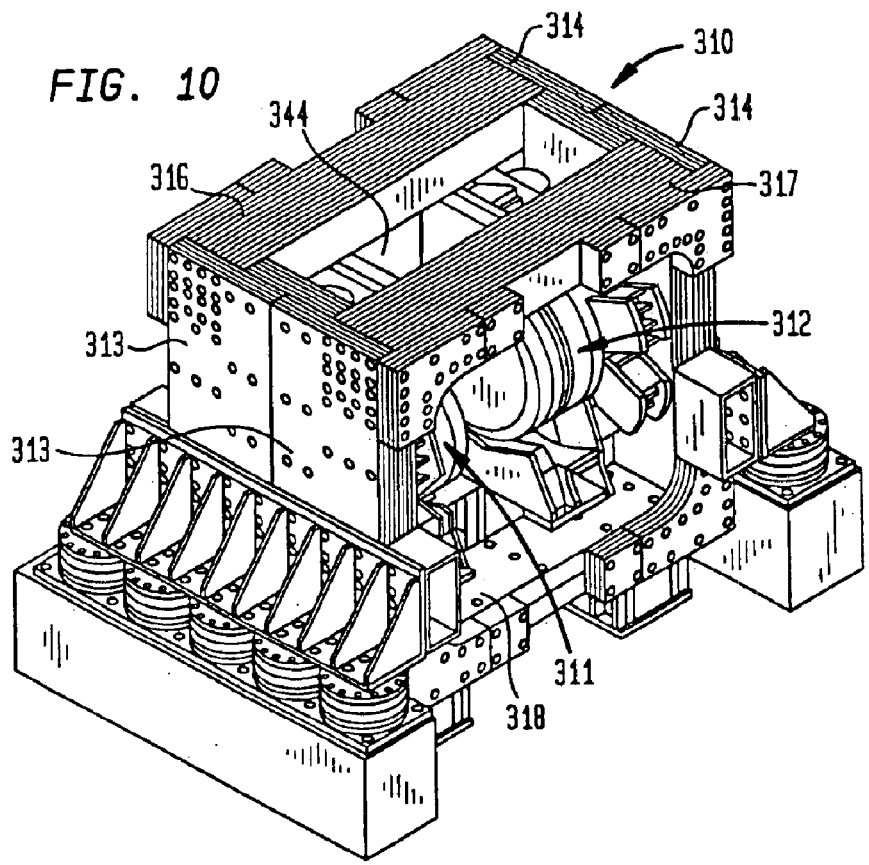
FIG. 10 is a perspective view of a magnetic resonance device in accordance with one embodiment of the invention.
Figure 11:
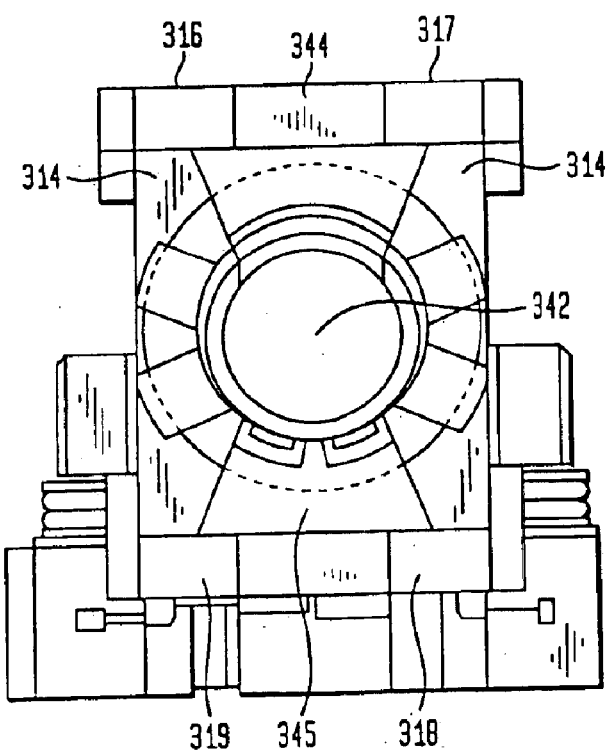
FIG. 11 is a sectional view taken along line 11—11 in FIG. 12.

Referring now to FIGS. 10, 11 and 12, another embodiment of the magnetic resonance imaging device having a horizontal pole axis is illustrated. A magnetic resonance imaging device 310 includes a magnet having a ferromagnetic frame and pole pieces 311,312 defining an opposing relationship along a horizontally oriented pole axis 342. The pole pieces define a patient-receiving gap 315. The frame includes first pole piece supports 313 and second pole piece supports 314. The pole piece supports 313,314 extend substantially vertically and support the pole pieces 311,312 in a substantially vertical direction. Thus the pole pieces define a horizontal pole axis through the gap 315. Flux return members 316–319 extend substantially horizontally between the first supports 313 and the second supports 314. Flux return members 316 and 317 define an upper opening 344 therebetween and flux return members 318 and 319 define a lower opening 345 therebetween. The pole axis 342 is aligned with the openings 344,345. Flux generating means such as permanent magnets, superconducting coils, or resistive electrical coils 320,321 are provided. The ferromagnetic frame is partially disposed within a floor 346.

The structural elements of the frame are formed of a plurality of laminated steel layers. Therefore, the first and second supports 313,314 comprise a plurality of steel layers laminated together via bolts, epoxy or other fastening means. The flux return members 316–319 are also formed of a plurality of laminated steel layers. Thus, in this embodiment of the invention, the pole axis is horizontally oriented.

The laminated steel layers according to the present invention are easier to fabricate than solid steel components of the typical ferromagnetic frames because the layers may be mass produced by a conventional stamping press. In addition, the individual layers are relatively light, up to a maximum of 290 pounds, compared to the typical solid steel components. Thus, the present invention further contemplates a method of constructing a magnetic resonance imaging device.

The method comprises forming a ferromagnetic frame at a site where the magnetic resonance imaging device will be utilized. First, the ferromagnetic frame including a flux return path and one or more of the structural elements is formed at the site. The frame is formed by laminating a plurality of steel layers together to form one of the structural elements of the frame, including the upper and lower support pieces 13, 14, the upper and lower pole stems 24, 25 and the flux return members 16–19. The appropriately shaped laminated steel layers 27, 28, and 29 are provided. Thus, for example, the lower support piece 14 may be constructed starting with the first laminated layer. Additional layers are laminated to the first layer until the lower support piece is complete. Then, the lower pole stem 25 may be assembled by laminating the first layer of the pole stem to the last layer of the lower pole support. Then, additional layers may be laminated together until the lower pole stem is completed. The flux return member 16–19 may then be assembled by laminating a first layer of each of the members to the appropriate position on the lower pole support 13.

Thus, one structural element of the frame is first completed and then any structural elements connected to the completed element are easily constructed by building upon the completed element. This process is repeated until the ferromagnetic frame is complete. When the frame is completed, the pole pieces 11, 12 are provided in an opposed relationship to define a patient-receiving gap therebetween.

In accordance with another embodiment of the invention, each of the structural elements may be assembled individually, either at a site or remote from the site. The magnetic resonance device may then be assembled at the site by connecting the individual structural elements together, for example, by bolting the elements together.

The method according to the present invention may be used to assemble a magnetic resonance imaging device in a room of a pre-existing building, since the laminated steel layers may be carried and maneuvered through the building and fit through the doorways. The pre-existing building may be any building, such as a hospital or a building dedicated to magnetic resonance imaging procedures.

The individual steel layers can be handled manually or with small equipment such as conventional lifting devices including small mobile lift trucks. Thus, there is no need for large, high-capacity equipment, such as cranes, during on-site assembly. Moreover, a particularly advantageous aspect of the invention is that it may be incorporated into pre-existing buildings since the layers are easily maneuverable. Thus, a new magnetic resonance device may be constructed into a pre-existing building since the size of the layers and the size of the required handling equipment allows the layers and equipment to be maneuvered through the doorways, halls and rooms of pre-existing buildings, with the need to remove large portions of walls. Even where some removal is required, the amount of such work is substantially less than that required for conventional magnetic resonance devices.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of constructing a ferromagnetic structure for a magnetic resonance imaging device at a site comprising the steps of:

forming a ferromagnetic frame in place at said site, said frame defining a flux return path and including one or more structural elements; and providing said ferromagnetic frame with a pair of pole pieces in an opposed relationship defining a patient-receiving gap therebetween;

said step of forming said ferromagnetic frame including laminating a plurality of steel layers at said site to form one or more of said one or more structural elements of said ferromagnetic frame.

2. A method as claimed in claim 1, comprising the step of providing a source of magnetic flux in association with said frame.

3. A method as claimed in claim 1, wherein said site is a room within a building.

4. A method as claimed in claim 1, wherein said step of laminating includes bolting said plurality of steel layers together.

5. A method as claimed in claim 1, wherein said step of laminating includes applying epoxy to each of said steel layers.

6. A method as claimed in claim 1, wherein said flux return path extends through at least one of said one or more structural elements formed from laminated steel layers.

7. A method as claimed in claim 1, wherein said one or more structural elements includes a pair of opposed pole supports, said pole pieces and said gap being disposed between said pole supports and said flux return path extending between said pole supports.

8. A method as claimed in claim 7, wherein said pole pieces are supported in an opposed relationship along a horizontal pole axis.

9. A method as claimed in claim 7, wherein said pole pieces are supported in an opposed relationship along a vertical pole axis.

10. A method as claimed in claim 9, wherein said pole supports extend substantially vertically and said flux return path includes a pair of upper members extending substantially horizontally between said pole support and a pair of lower members extending substantially horizontally between said pole supports, said upper members defining an opening therebetween and said lower members defining an opening therebetween, wherein said openings are aligned with said pole axis.

11. A method as claimed in claim 1, wherein said steel layers are low carbon sheets.

12. A method as claimed in claim 11, wherein said low carbon sheets have a thickness in the range of about 0.014 inch to account 0.500 inch.

13. A method as claimed in claim 3, wherein said step of forming a ferromagnetic frame includes forming said room from said frame.

14. A method of constructing a ferromagnetic structure for a magnetic resonance imaging device at a site comprising the steps of:

forming a ferromagnetic frame in place at said site, said frame defining a flux return path and including one or more structural elements; and providing said ferromagnetic frame with a pair of pole pieces in an opposed relationship defining a patient-receiving gap therebetween;

said step of forming said ferromagnetic frame including the steps of:

laminating a plurality of steel layers at said site to form one of said one or more structural elements; and laminating a plurality of steel layers to said one structural element to form another one of said one or more structural elements.

15. A method as claimed in claim 14, wherein said step of laminating a plurality of steel layers to said one structural element is repeated until said frame is complete.

16. A method of constructing a ferromagnetic structure for a magnetic resonance imaging device comprising the steps of:

forming one or more structural elements of a ferromagnetic frame defining a flux return path;

providing said one or more structural elements at a site;

connecting said one or more structural elements to form said ferromagnetic frame; and providing said ferromagnetic frame with a pair of pole pieces in an opposed relationship defining a patient-receiving gap therebetween;

said step of forming said one or more structural elements including laminating a plurality of steel layers to form one or more of said one or more structural elements of said ferromagnetic frame.

* * * * *

UNITED STATES PATENT AND TRADEMARK OFFICE
CERTIFICATE OF CORRECTION

PATENT NO.   : 6,879,157 B1
DATED         : April 12, 2005
INVENTOR(S) : Luciano B. Bonanni and Anthony Tenore It is certified that error appears in the above-identified patent and that said Letters Patent is hereby corrected as shown below:

<u>Title page,</u>
Item [57], ABSTRACT,
Line 16, "dues" should read -- due --.

<u>Column 1,</u>
Line 60, cancel the word "a".

<u>Column 2,</u>
Line 15, cancel the first occurrence of the word "the".
Line 28, "elements of" should read -- elements of the --.

<u>Column 3,</u>
Line 65, "comprise" should read -- comprises --.

<u>Column 4,</u>
Line 61, "is" should read -- are --.

<u>Column 6,</u>
Line 53, "is" should read -- are --.

<u>Column 9,</u>
Line 30, "includes" should read -- include --.

<u>Column 10,</u>
Line 7, "account" should read -- about --.

Signed and Sealed this

Sixteenth Day of August, 2005

JON W. DUDAS
*Director of the United States Patent and Trademark Office*